(12) United States Patent
Ode

(10) Patent No.: US 8,779,607 B2
(45) Date of Patent: Jul. 15, 2014

(54) DEVICES WITH COVERING LAYER AND FILLER

(75) Inventor: Hiroyuki Ode, Tokyo (JP)

(73) Assignee: PS4 Luxco S.A.R.L., Luxembourg (LU)

(*) Notice: Subject to any disclaimer, the term of this patent is extended or adjusted under 35 U.S.C. 154(b) by 138 days.

(21) Appl. No.: 13/156,948

(22) Filed: Jun. 9, 2011

(65) Prior Publication Data

US 2011/0309499 A1 Dec. 22, 2011

(30) Foreign Application Priority Data

Jun. 17, 2010 (JP) ................................. 2010-137879

(51) Int. Cl.
*H01L 23/29* (2006.01)
*H01L 23/28* (2006.01)

(52) U.S. Cl.
USPC ........... 257/792; 257/787; 257/788; 257/789; 257/790; 257/795

(58) Field of Classification Search
USPC ......... 257/678, 685, 686, 687, 723–726, 729, 257/787–795, E25.001, E25.01, E25.013, 257/E23.001, E23.194; 438/106, 107, 109, 438/118
See application file for complete search history.

(56) References Cited

U.S. PATENT DOCUMENTS

| | | | | |
|---|---|---|---|---|
| 4,238,528 A | * | 12/1980 | Angelo et al. | 427/96.3 |
| 5,371,328 A | * | 12/1994 | Gutierrez et al. | 174/261 |
| 7,547,579 B1 | * | 6/2009 | Jiang | 438/118 |
| 2003/0203535 A1 | * | 10/2003 | Kodnani et al. | 438/106 |
| 2005/0051883 A1 | * | 3/2005 | Fukazawa | 257/686 |
| 2011/0244628 A1 | * | 10/2011 | Ode et al. | 438/109 |
| 2011/0285014 A1 | * | 11/2011 | Shen et al. | 257/737 |
| 2011/0287582 A1 | * | 11/2011 | Shimada et al. | 438/107 |

FOREIGN PATENT DOCUMENTS

| | | |
|---|---|---|
| JP | 2000-269166 A | 9/2000 |
| JP | 2002-141643 A | 5/2002 |
| JP | 2002-270721 A | 9/2002 |
| JP | 2003-309227 | 10/2003 |
| JP | 2004-179590 A | 6/2004 |
| JP | 2007-59441 | 3/2007 |
| JP | 2009-146863 A | 8/2009 |
| JP | 2010-087418 A | 5/2010 |

\* cited by examiner

*Primary Examiner* — Yasser A Abdelaziez
*Assistant Examiner* — Cory Eskridge
(74) *Attorney, Agent, or Firm* — Foley & Lardner LLP

(57) ABSTRACT

A method of manufacturing a device includes forming a covering layer having affinity for a filler to be injected into a space between a first base and a second base, on at least one of the opposing surfaces of the first base and the second base, and then injecting the filler into the space between the first base and the second base.

20 Claims, 5 Drawing Sheets

DEVICES WITH COVERING LAYER AND FILLER

This application is based upon and claims the benefit of priority from Japanese patent application No. 2010-137879, filed on Jun. 17, 2010, the disclosure of which is incorporated herein in its entirety by reference.

BACKGROUND OF THE INVENTION

This invention relates to a method of a manufacturing a device, and in particular to a method of manufacturing a semiconductor device involving an underfill injection process.

When a semiconductor device has a semiconductor chip mounted on a mounting board, or a semiconductor device is formed by stacking a plurality of semiconductor chips, a resin material called "underfill" is injected into a space between the board and the semiconductor chip or between the stacked semiconductor chips and cured in order to protect bumps, to enhance the connection strength, and to improve the moisture resistance.

In general, a side-fill method utilizing capillary action is employed to inject an underfill material (filler). However, as the degree of integration within a semiconductor device increases, the gap between a board and a semiconductor chip or between semiconductor chips becomes smaller, which leads to various problems, including increased time required for the injection, generation of voids in the injected resin, and unwanted interruption of the injection process.

In order to solve these problems, Japanese Laid-Open Patent Publication No. 2007-59441 (Patent Document 1) proposes to plasma treat, with $N_2$ gas, the surface of at least one of the semiconductor chip and the mounting board before injecting the underfill material into the space between the mounting board and the semiconductor chip. It is claimed that, according to this method, the angle of contact between the epoxy-based underfill material and a passivation film becomes smaller, and hence the wettability of the underfill material with the passivation film is improved, resulting in improved filling property of the underfill material.

SUMMARY

However, the present inventor recognized that the plasma treatment as described in Patent Document 1 may lead to a problem that a device in the semiconductor chip is electrically broken.

Describing in more detail, there are formed, on the surface of the semiconductor chip, a multiplicity of electrically conductive bumps connected to internal through electrodes. When exposed to plasma, these bumps serve as antennas to collect electric charge contained in the plasma. The electric charge collected by the bumps flows into the device within the semiconductor chip via the through electrodes connected to the bumps. The device will be broken if a large amount of electric charge flows into the device. Thus, the plasma treatment of the semiconductor chip may lead to a problem of electrical breakdown of the device in the semiconductor chip.

This invention seeks to solve the problem at least in part.

In one embodiment, there is provided a device that includes: a first base; a second base arranged above the first base to leave a space; a filler disposed in the space; and a covering layer formed on at least one of the opposing surfaces of the first base and the second base, and having affinity for the filler.

In another embodiment, there is provided a semiconductor device that includes: a first substrate; a second substrate that is stacked over the first substrate via a bump electrode to form a gap between the first substrate and the second substrate; a resin layer that is formed in the gap; and a first covering layer that is intervening between the resin layer and the first substrate. In the device, the first covering layer is higher in wettability with respect to the resin layer than the first substrate.

In still another embodiment, there is provided a semiconductor device that includes: a stack structure including a plurality of substrates stacked over with one another via a bump electrode to form gaps between adjacent ones of the plurality of substrates; a resin layer that is formed in the gaps; and a covering layer that is intervening between the resin layer and adjacent ones of the plurality of substrates.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

The description will start with principles of this invention.

A side-fill method, which is used to inject an underfill material, utilizes capillary action. The capillary action is caused by surface tension of liquid entering into a capillary tube and wettability of a wall surface to the liquid, as expressed by the following general formula (when the liquid in a tubular object moves upward):

$$h = 2T\cos\theta/\rho gr$$

where h denotes a height to which the liquid level rises, T denotes a surface tension, θ denotes a contact angle (parameter for determining wettability), ρ denotes a liquid density, g denotes a gravity acceleration, and r denotes an inner diameter of the tube.

As is seen from the formula above, the height h to which the liquid level is caused to rise by the capillary action can be increased by reducing the contact angle that is a parameter for determining the wettability. This means that injection of the underfill material (filler) can be made easier by improving the wettability of the surfaces of the semiconductor chip and the mounting board to a resin material used for the underfill. According to this invention, therefore, the wettability is improved by forming, before injection of the underfill material, a covering film having a region with affinity for the underfill material on the surface(s) of the semiconductor chip or (and) the mounting board.

Next, referring to FIGS. 1A to 1D, a semiconductor device manufacturing method according to a first embodiment of this invention will be described.

Figure 1A:
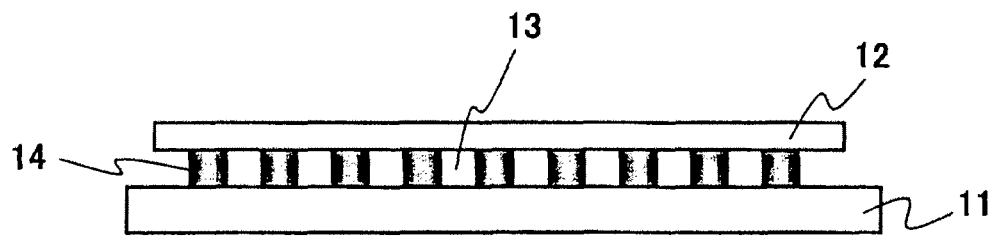
FIGS. 1A to 1D are process charts for explaining a semiconductor device manufacturing method according to a first embodiment of this invention.

At first, first and second bases 11 and 12 are provided. As shown in FIG. 1A, the second base 12 is arranged above the first base 11. There is formed between the first base 11 and the second base 12 a space 13, which is to be filled with an underfill material. The first base 11 may be, for example, a mounting board, and the second base 12 may be, for example, a semiconductor chip mounted on the mounting board. There are a plurality of bumps 14 between the mounting board and the semiconductor chip, and these bumps 14 electrically connect the mounting board and the semiconductor chip. The presence of the bumps 14 forms the space 13 between the mounting board and the semiconductor chip, which is to be filled with the underfill material.

Figure 1B:
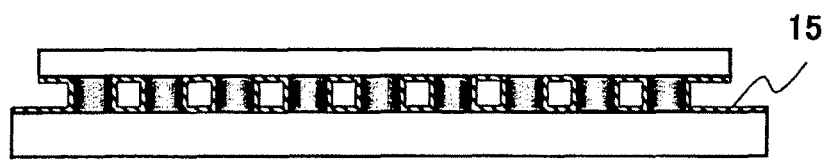

Next, as shown in FIG. 1B, a covering layer 15 having a region with affinity for the underfill material is formed (deposited) on the surfaces exposed to the space 13. Then, the surfaces exposed to the space 13 is coated with the covering layer 15. The covering layer 15 may be a molecular layer or a thin film. Formation of the covering layer 15 may be carried out by using various methods such as an evaporation method, a chemical vapor deposition (CVD) method, and a supercritical deposition method.

Figure 2:
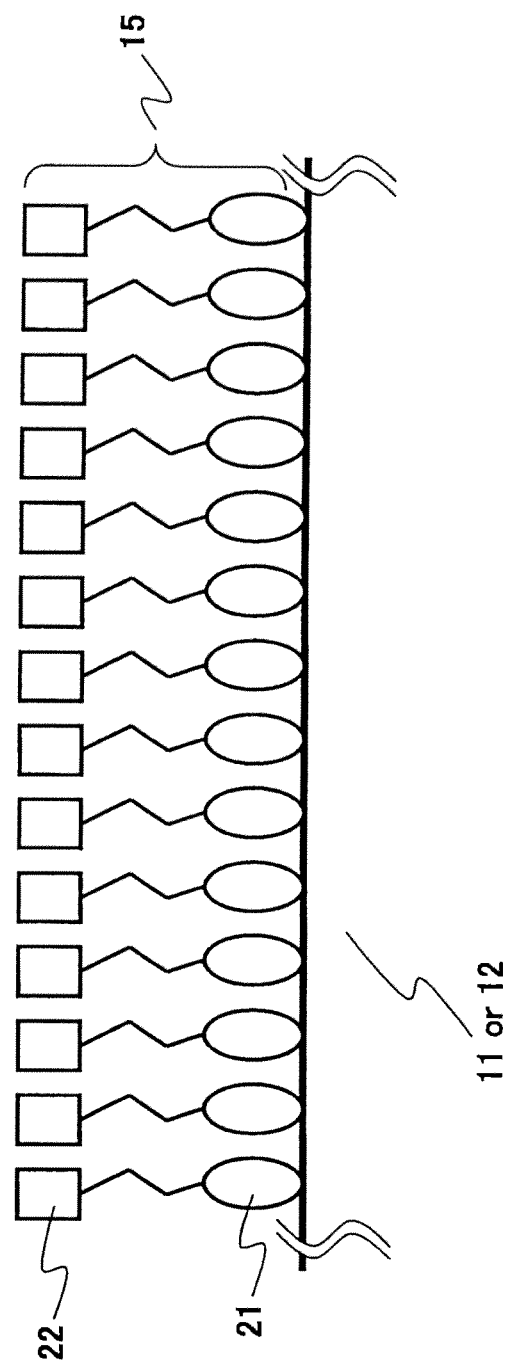
FIG. 2 is a model diagram illustrating a covering layer formed by the semiconductor device manufacturing method according to the first embodiment of the invention.

FIG. 2 is a diagram showing a model of a molecular layer forming the covering layer 15. As shown in FIG. 2, the covering layer 15 desirably has a region 21 which has affinity for or can be combined with the surface of the first base 11 or the second base 12, and a region 22 which has affinity for or can be combined with the underfill material.

Figure 1C:
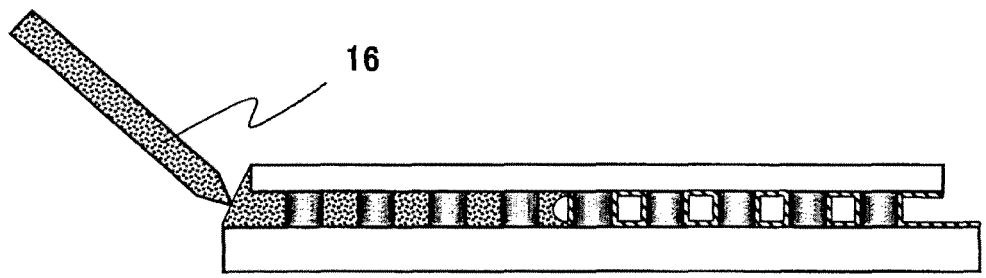
Figure 1D:
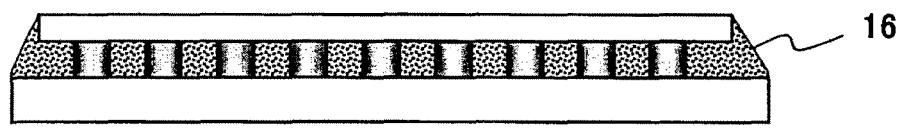

Then, as shown in FIGS. 1C and 1D, the underfill material (resin material) 16 is injected into the space 13 between the first base 11 and the second base 12 by means of a side-fill method.

Since the surfaces exposed to the space 13 are coated with the covering layer 15 having affinity for the underfill material 16, the underfill material 16 is allowed to enter the space 13 rapidly or easily. This means that, even if the gap between the first base 11 and the second base 12 is so small that the underfill material 16 is inhibited from entering the gap, the underfill material 16 is allowed to enter the gap easily by virtue of the provision of the covering layer 15 according to this embodiment of the invention. Further, generation of voids can be prevented or suppressed even if the surface of the first base 11 or the second base 12 is formed of a material which is incompatible with or which has low wettability to the underfill material 16.

Finally, the underfill material 16 is heated and cured.

In this manner, a semiconductor device is obtained in which the second base 12 is mounted on the first base 11 and the space between the first and second bases is filled with the underfill. The underfill material may be an epoxy resin mixed with a curing agent. The covering layer 15 may be formed not only of the epoxy resin having no curing agent added thereto, but also may be formed of polyimide. Components of the covering layer 15 are determined in consideration of materials of the surfaces of the first base and the second base, and composition of the underfill material. A material for the covering layer 15 is selected which has a region with affinity for the first base and the second base and a region with affinity for the underfill material.

According to this embodiment, as described above, a covering layer having affinity for the filler which is injected between the first and second bases is preliminarily formed on at least one of the opposing surfaces of the first and second bases. Even if either the first base or the second base is a semiconductor chip, unlike plasma treatment, no device built in the semiconductor chip will be electrically broken in this process. Therefore, this method is capable of improving the wettability of the surface of at least either the first base or the second base to the resin material without the risk of electrical breakdown.

Next, formation of the covering layer 15 will be described in further detail with reference to FIG. 3. Description here will be made of a case in which a polyimide film is formed as the covering layer 15, using a CVD method.

Figure 3:
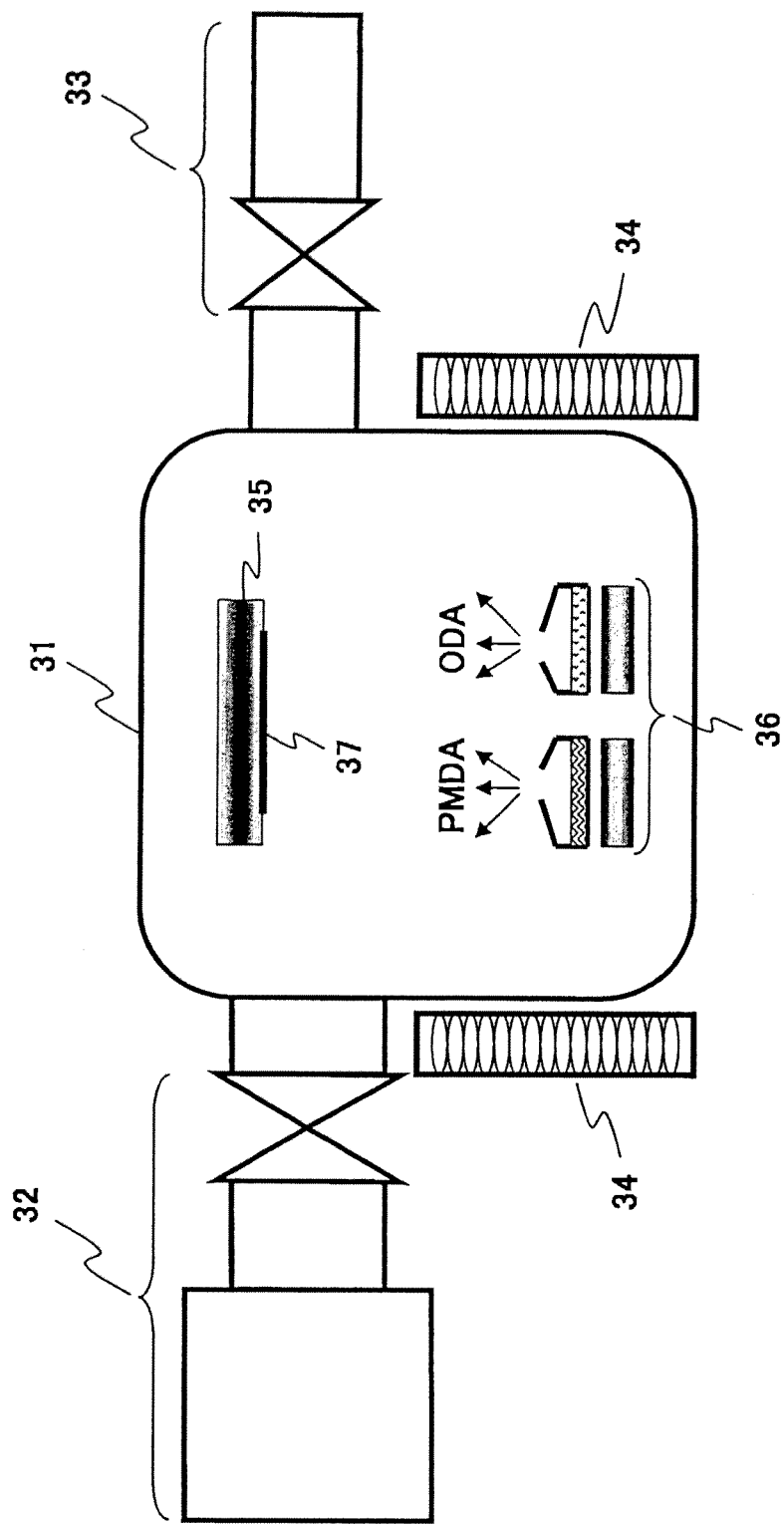
FIG. 3 is a diagram illustrating a schematic configuration of a CVD system that can be used to form the covering layer.

As shown in FIG. 3, a CVD system has a vacuum chamber 31, a load lock system 32, an exhaust system 33, and a heater 34. The vacuum chamber 31 has therein a sample holder 35 and two raw material vaporizers 36, each having a heater.

A base 37 to be treated is introduced into the vacuum chamber 31 through the load lock system 32, and held by the sample holder 35. The base 37 as used herein may be the first base 11 or the second base 12, or a structure in which the second base 12 is mounted on the first base 11. This means that the formation of the covering layer 15 may be carried out either before or after the second base 12 is mounted on the first base 11. Further, the covering layer 15 need not necessarily be formed on both of the opposing surfaces of the first base 11 and the second base 12, but may be formed only on either one of the surfaces that has poorer compatibility or wettability with respect to the underfill material.

PMDA (Pyromellitic Dianhydride) and ODA (4,4'-diamino-diphenyl ether, or 4,4'-oxydianiline) as raw materials for the covering layer 15 are placed in the two raw material vaporizers 36, respectively.

Then, the vacuum chamber 31 is evacuated by an exhaust system 33 to a pressure between about $1\times10^{-4}$ and $1\times10^{-3}$ Pa, and to a pressure of $2\times10^{-4}$ Pa, for example. The base 37 is heated to an arbitrary temperature by the heater provided in the sample holder 35. The base 37 may be heated to a temperature between room temperature and about 180° C., and preferably between 160° C. and 180° C.

Then, the PMDA and the ODA are heated by the respective heaters of the raw material vaporizers 36 to a temperature between 160° C. and 180° C. to be vaporized thereby. The vaporized PMDA and ODA react with each other on the surface of the base 37 to produce a polyamide acid (PMDA+ODA→PAA). This reaction is continued for several minutes, whereby a PAA film with a thickness of several to several tens nm is formed on the surface of the base 37.

When the base 37 is a structure having the second base 12 mounted on the first base 11, the vaporized PMDA and ODA enter the gap (that is, the space 13) between the first base 11 and the second base 12, whereby a PAA film is formed on the surfaces of the first base 11 and the second base 12.

The PAA film formed as described above is heated to about 300° C. (subjected to imidizing heat) whereby the PAA film is changed to PI (polyimide). The heating of the PAA film can be carried out not only in a vacuum, but also in air atmosphere or nitrogen atmosphere. The covering layer 15 of polyimide is formed in this manner.

Although the foregoing description has been made of a case in which the covering layer 15 is formed by chemical reaction between PMDA and ODA, the covering layer 15 may be formed without involving any chemical reaction. For example, PMDA is vaporized in the same manner as described above to form a PMDA layer on the surface of the base 37. Likewise, another organic material (for example, an epoxy resin) is vaporized so that a molecular layer or thin film thereof is formed on the surface of the base 37. In any case, when the base 37 is a structure composed of the first base 11 and the second base 12, the vaporized material of the covering layer 15 will enter the gap between the first base 11 and the second base 12 and form the covering layer 15 on the exposed surfaces exposed to the gap.

Figure 4:
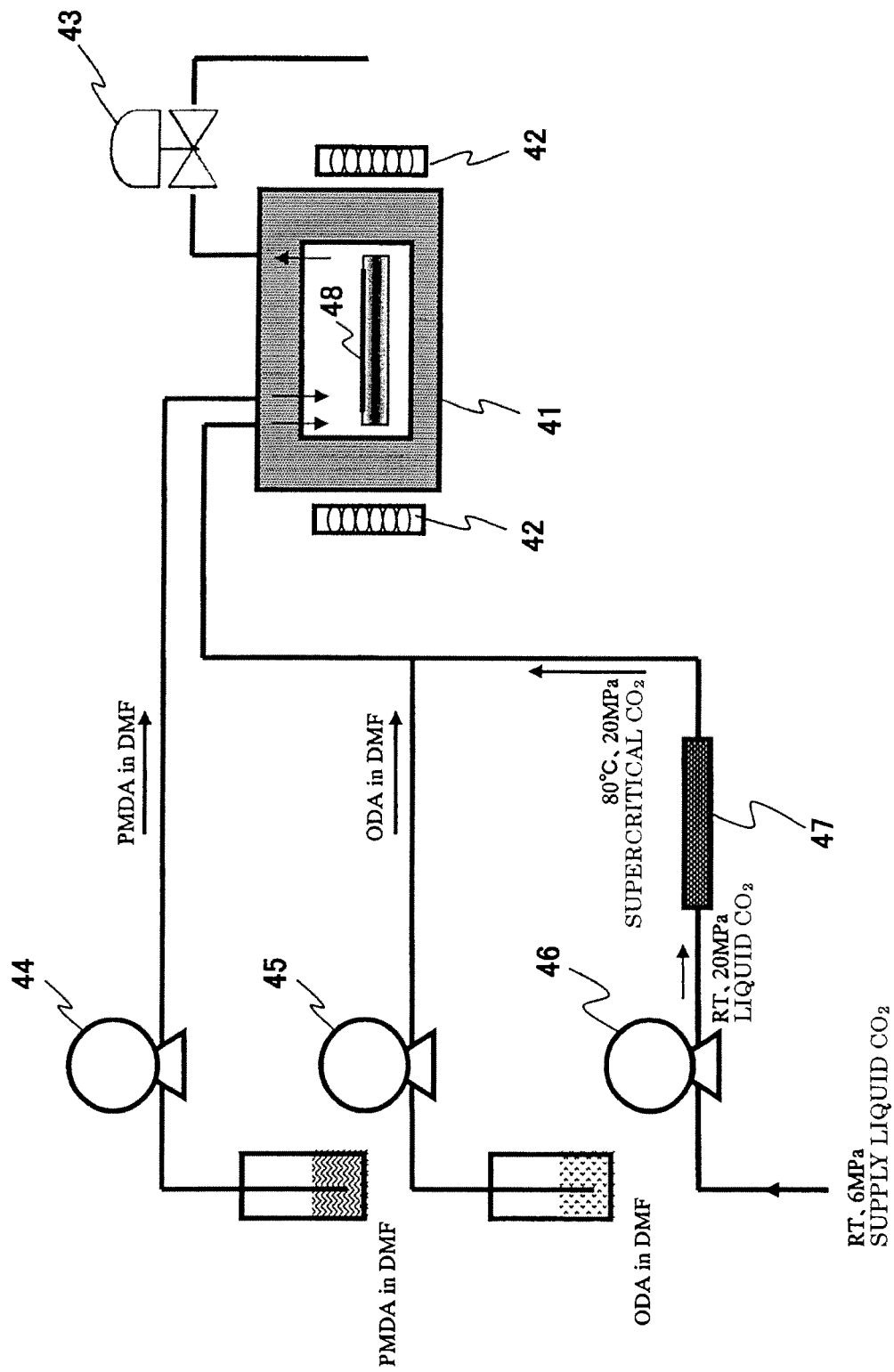
FIG. 4 is a diagram illustrating a schematic configuration of a supercritical deposition system that can be used to form the covering layer.

Further, the covering layer 15 may be formed by using a supercritical deposition method. Referring to FIG. 4, a method of forming the covering layer 15 by using the supercritical deposition method will be described.

As shown in FIG. 4, a supercritical deposition system has a deposition chamber 41, a heater 42, a back pressure regulator 43, solution feeding pumps 44, 45, 46, and a heat exchanger 47. The deposition chamber 41 is filled with supercritical $CO_2$ after a base 48 is introduced into the chamber.

The heater 42, the back pressure regulator 43, the solution feeding pump 46 and the heat exchanger 47 are used in order to keep the supercritical state of $CO_2$ in the deposition chamber 41.

The solution feeding pump 46 receives liquid $CO_2$ at room temperature and a pressure of 6 Pa, for example, and delivers the same at room temperature and a pressure of 20 MPa. The heat exchanger 47 changes the $CO_2$ having room temperature and a pressure of 20 MPa supplied by the solution feeding pump 46 into a supercritical state at a temperature of 80° C. and a pressure 20 MPa, for example, and delivers the same to the deposition chamber 41. The heater 42 adjusts and maintains the temperature of the supercritical $CO_2$ in the deposition chamber 41 while the back pressure regulator 43 adjusts and maintains the pressure in the deposition chamber 41, whereby the supercritical $CO_2$ in the deposition chamber 41 is kept in a state at a pressure of 20 MPa and a temperature of 80° C., for example.

When polyimide is deposited to form the covering layer 15, PMDA and ODA as raw materials are dissolved separately in an arbitrary solvent, for example in DMF (N,N-dimethyl formamide), and the PMDA solution and the ODA solution thus obtained are fed into the deposition chamber 41 by the solution feeding pumps 44, 45, respectively. The PMDA solution and the ODA solution are mixed with the supercritical $CO_2$ in the deposition chamber 41.

On the other hand, the base 48 is being heated to a reaction temperature, for example to 300° C. by the heater provided in the sample holder holding the base 48, within the deposition chamber 41. The PMDA and ODA introduced into the deposition chamber 41 react with each other on the surface of the heated base 48. Since the temperature of the base is higher than the imidization temperature, the PMDA and the ODA react with each other to form a polyimide film.

In this manner as described above, the covering film 15 can be formed by a supercritical deposition method as well. According to this method, the film can be formed more uniformly on the exposed surfaces in the gap between the first base and the second base.

Next, a second embodiment of this invention will be described with reference to FIGS. 5A and 5B.

Figure 5A:
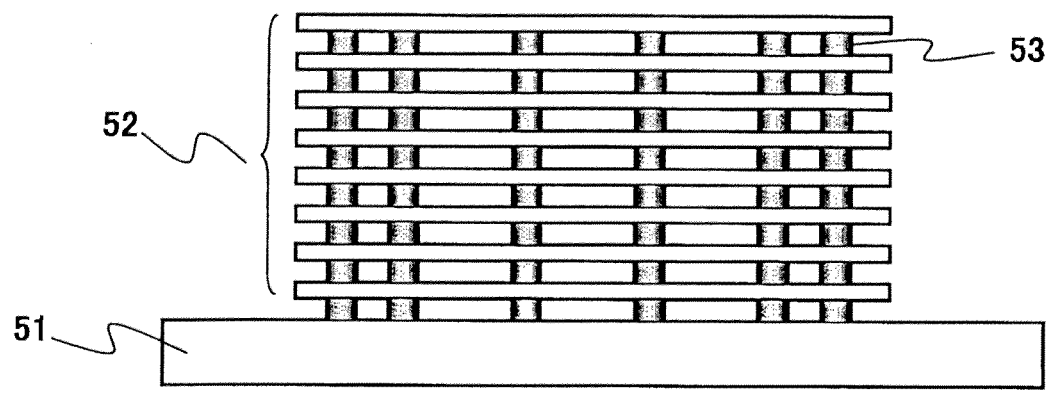
FIG. 5A is a diagram illustrating a state of a semiconductor device before injection of underfill according to a second embodiment of this invention.

FIG. 5A illustrates a state of a stacked LSI, for example a stacked DRAM in the course of its manufacturing process. A plurality of DRAM chips 52 are mounted on a mounting board 51 with a distance of 5 to 10 μm from each other. When the DRAM chips are stacked with this distance, it will take a long time or will be difficult to inject underfill using a side-fill method, in general.

Each of the DRAM chips 52 has a plurality of through electrodes (TSVs, or through silicon vias), and these through electrodes are connected to through electrodes of other DRAM chip(s) 52 located on and/or under the DRAM chip via bumps 53

The stacked DRAMs in the state as shown in FIG. 5A are very weak in mechanical terms. Therefore, injection of underfill is indispensable to protect junctions (the bumps 53) and to enhance the mechanical strength (reliability).

The stacked DRAMs in the state as shown in FIG. 5A are introduced into a CVD chamber in the same manner as in the first embodiment. In a reduced-pressure atmosphere (or in a vacuum), an epoxy resin material (having no curing agent added thereto) is vaporized as a raw material for a covering film having a region with affinity for the underfill material. The vaporized epoxy resin is diffused in the CVD chamber, and deposited all over the exposed surfaces of the stacked DRAMs to form a covering layer (coating film). The covering layer is formed to a thickness of several to several hundred nm. If there is any region where the formation of the covering film should be avoided (for example, the upper surface of the uppermost stacked DRAM), such region should be preliminarily masked.

Figure 5B:
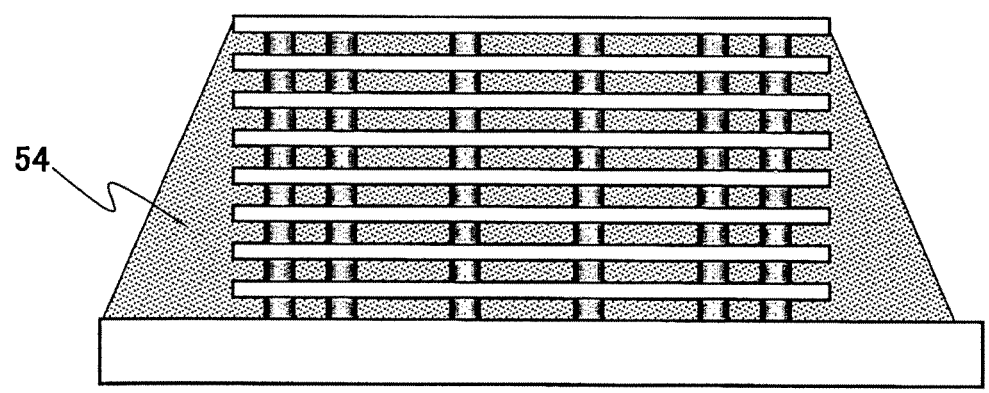
FIG. 5B is a diagram illustrating a state in which the underfill has been injected into the semiconductor device of FIG. 5A.

Next, as shown in FIG. 5B, an epoxy resin (mixed with a curing agent) as an underfill material 54 is injected into space between the mounting board 51 and the DRAM chips 52 as well as into the spaces between the DRAM chips 52 by means of a side-fill method. Since the covering layer of an epoxy resin is formed on the exposed surfaces of the stacked DRAMs to provide high wettability to the underfill material 54, the underfill material 54 is allowed to quickly enter the spaces between the DRAM chips 52 in spite of narrowness of the spaces. Generation of voids can also be prevented or reduced. The underfill material 54 is then heated and cured, and a stacked DRAM is completed.

According to this second embodiment as well, as described in the above, the underfill material can be injected easily in spite of the small distance between the DRAM chips (and the DRAM chip and the mounting board 51), and generation of voids can be prevented or reduced. This makes it possible to provide a stacked DRAM having high reliability without joint failure between the DRAM chips, and without causing electrical breakdown of the DRAM chips.

Although, in the foregoing description, a covering film having affinity for the underfill is formed after a plurality of DRAM chips are mounted on a mounting board, the covering film may be formed before mounting the DRAM chips. In this case, if the CVD device shown in FIG. 3, for example, is used for formation of the covering film, the covering film is formed on one surface of each DRAM chip at a time. If one surface of each DRAM chip is of a material different from that of the other surface, the covering film may be formed only on the surface that has poorer compatibility with the underfill. For example, if one surface of the DRAM chip is covered with polyimide while the other surface is covered with a silicon nitride (SiN) film, the covering film may be formed only on the surface covered with the SiN film. Obviously, the covering film may be formed on both of the surfaces of each DRAM chip. The covering film may be formed of a material having a region with affinity for the SiN film (for example, a hydroxyl group), and having a region with affinity (lipophilicity) with the underfill material (for example, an epoxy resin).

The DRAM chips having the covering film formed on one or both surface(s) thereof are stacked on the mounting board and the underfill material is injected into the spaces between the stacked DRAM chips, whereby a stacked DRAM similar to the one shown in FIG. 5B is obtained.

Although the inventions has been described above in connection with several preferred embodiments thereof, it will be appreciated by those skilled in the art that those embodiments are provided solely for illustrating the invention, and should not be relied upon to construe the appended claims in a limiting sense. For example, the material of the covering film is not limited to an epoxy resin or polyimide, and other organic molecular materials can be selectively used in accordance with the surface materials of the first and second bases and composition of a sealing agent. This invention is applicable to not only a device including a DRAM chip but also various semiconductor devices.

The whole or part of the exemplary embodiments disclosed above can be described as, but not limited to, the following supplementary notes.

(Supplementary Note 1) A method of manufacturing a device, comprising:
forming a covering layer having affinity for a filler to be injected into a space between a first base and a second base, on at least one of the opposing surfaces of the first base and the second base; and
injecting the filler into the space between the first base and the second base.

(Supplementary Note 2) The method of manufacturing a device as described in Supplementary Note 1, wherein the formation of the covering layer is performed by vaporizing a material of the covering layer.

(Supplementary Note 3) The method of manufacturing a device as described in Supplementary Note 2, wherein the formation of the covering layer is performed with at least one of the first base and the second base placed in a reduced-pressure atmosphere.

(Supplementary Note 4) The method of manufacturing a device as described in Supplementary Note 1, wherein the filler is an epoxy resin mixed with a curing agent, and the material of the covering layer is an epoxy resin which is not mixed with a curing agent.

(Supplementary Note 5) The method of manufacturing a device as described in Supplementary Note 1, wherein the covering layer is formed of polyimide.

(Supplementary Note 6) The method of manufacturing a device as described in Supplementary Note 1, wherein the filler is injected by utilizing capillary action.

(Supplementary Note 7) The method of manufacturing a device as described in Supplementary Note 1, wherein the formation of the covering layer is performed after the second base is arranged above the first base.

(Supplementary Note 8) The method of manufacturing a device as described in Supplementary Note, wherein the formation of the covering layer is performed on at least one of the first base and the second base before the second base is arranged above the first base.

(Supplementary Note 9) The method of manufacturing a device as described in Supplementary Note 1, wherein both of the first base and the second base are a semiconductor chip.

(Supplementary Note 10) The method of manufacturing a device as described in Supplementary Note 1, wherein the first base is a mounting board and the second base is a semiconductor chip.

What is claimed is:
1. A device comprising:
a first base;
a second base arranged above the first base to leave a space;
a filler disposed in the space; and
a covering layer formed on both of the opposing surfaces of the first base and the second base and contacting the filler, wherein the covering layer is higher in wettability with respect to the filler than with respect to at least one of the opposing surfaces of the first base and the second base,
wherein the covering layer is a polyimide film.

2. The device as claimed in claim 1, wherein both of the first base and the second base are a semiconductor chip.

3. The semiconductor device as claimed in claim 1, wherein the first base is a mounting board, and the second base is a semiconductor chip.

4. A device comprising:
a first base;
a second base arranged above the first base to leave a space;
a filler disposed in the space; and
a covering layer formed on at least one of the opposing surfaces of the first base and the second base and contacting the filler, wherein the covering layer is higher in wettability with respect to the filler than with respect to the at least one of the opposing surfaces of the first base and the second base,
wherein the filler is an epoxy resin mixed with a curing agent, and material of the covering layer is an epoxy resin that is not mixed with a curing agent.

5. A semiconductor device comprising:
a first substrate;
a second substrate that is stacked over the first substrate via a bump electrode to form a gap between the first substrate and the second substrate;
a resin layer that is formed in the gap; and
a first covering layer that is intervening between the resin layer and the first substrate and contacts the resin layer and the first substrate,
wherein the first covering layer is higher in wettability with respect to the resin layer than with respect to the first substrate,
wherein the first covering layer is a polyimide film.

6. The semiconductor device as claimed in claim 5, wherein both of the first substrate and the second substrate are a semiconductor chip.

7. The semiconductor device as claimed in claim 5, wherein the first substrate is a mounting board, and the second substrate is a semiconductor chip.

8. The semiconductor device as claimed in claim 5, further comprising:
a second covering layer that is intervening between the resin layer and the second substrate and contacts the resin layer, wherein the second covering layer is higher in wettability with respect to the resin layer than with respect to the second substrate.

9. A semiconductor device comprising:
a first substrate;
a second substrate that is stacked over the first substrate via a bump electrode to form a gap between the first substrate and the second substrate;
a resin layer that is formed in the gap; and
a first covering layer that is intervening between the resin layer and the first substrate and contacts the resin layer,
wherein the first covering layer is higher in wettability with respect to the resin layer than with respect to the first substrate,
wherein the resin layer is an epoxy resin mixed with a curing agent, and material of the first covering layer is an epoxy resin that is not mixed with a curing agent.

10. The semiconductor device as claimed in claim 5, wherein the first substrate is larger in size than the second substrate.

11. The semiconductor device as claimed in claim 5, wherein the first covering layer is extending from the first substrate to the bump electrode.

12. A semiconductor device comprising:
a stack structure including a plurality of substrates stacked over with one another via a bump electrode to form gaps between adjacent ones of the plurality of substrates, the substrates including an intermediate substrate sandwiching between the substrates, the intermediate substrate having a first surface, a second surface opposite to the first surface and a polyimide film formed over the first surface;
a resin layer that is formed in the gaps; and
a covering layer provided over the second surface of the intermediate substrate, and the covering layer being between the resin layer and the intermediate substrate,
wherein the covering layer is higher in wettability with respect to the resin layer than with respect to the second surface of the intermediate substrate, and
each of the polyimide film and the covering layer is in contact with the resin layer.

13. The semiconductor device as claimed in claim 12, wherein the plurality of substrates are semiconductor chips.

14. The semiconductor device as claimed in claim 12, wherein a lowermost of the plurality of substrates is a mounting board, and another of the plurality of substrates is a semiconductor chip.

15. The semiconductor device as claimed in claim 12, wherein a lowermost of the plurality of substrates of the stack structure is larger in size than another of the plurality of substrates of the stack structure.

16. The semiconductor device as claimed in claim 12, wherein the covering layer is extending to the bump electrode.

17. The semiconductor device as claimed in claim 6, wherein at least one of the first substrate and the second substrate includes a through electrode that is electrically connected to the bump electrode.

18. The semiconductor device as claimed in claim 12, wherein the covering layer is a polyimide film.

19. The semiconductor device as claimed in claim 12, wherein the resin layer is an epoxy resin mixed with a curing agent, and the covering layer is an epoxy resin that is not mixed with a curing agent.

20. The semiconductor device as claimed in claim 13, wherein the intermediate substrate includes a through electrode that is electrically connected to the bump electrode.

* * * * *